(12) United States Patent
Chang et al.

(10) Patent No.: US 12,431,858 B2
(45) Date of Patent: Sep. 30, 2025

(54) ELECTRONIC STRUCTURE AND METHOD OF MANUFACTURING THE SAME

(71) Applicant: WIN SEMICONDUCTORS CORP., Taoyuan (TW)

(72) Inventors: Chia-Ta Chang, Taoyuan (TW); Po-Wei Ting, Taoyuan (TW)

(73) Assignee: WIN SEMICONDUCTORS CORP., Taoyuan (TW)

( * ) Notice: Subject to any disclaimer, the term of this patent is extended or adjusted under 35 U.S.C. 154(b) by 640 days.

(21) Appl. No.: 17/825,092

(22) Filed: May 26, 2022

(65) Prior Publication Data
US 2023/0387880 A1  Nov. 30, 2023

(51) Int. Cl.
| H03H 9/02 | (2006.01) |
| H01L 23/00 | (2006.01) |
| H03H 3/08 | (2006.01) |
| H03H 9/05 | (2006.01) |
| H03H 9/10 | (2006.01) |

(52) U.S. Cl.
CPC ......... H03H 9/02992 (2013.01); H01L 24/11 (2013.01); H03H 9/02984 (2013.01); H03H 9/059 (2013.01); *H01L 2224/11849* (2013.01)

(58) Field of Classification Search
CPC ...... H03H 9/1071; H03H 9/1085; H03H 9/08; H01L 24/13; H01L 24/11; H01L 2224/13564; H01L 2224/1357; H01L 2224/13023; H01L 2224/13007
See application file for complete search history.

(56) References Cited

U.S. PATENT DOCUMENTS

| 7,609,129 B2 | 10/2009 | Yokota et al. |
| 8,008,837 B2 | 8/2011 | Fukano et al. |
| 8,232,193 B2 | 7/2012 | Chang |
| 9,190,373 B2* | 11/2015 | Migita .................... H01L 24/13 |
| 9,478,213 B2 | 10/2016 | Tajima |
| 10,804,950 B2 | 10/2020 | Kimura et al. |
| 11,757,426 B2 | 9/2023 | Hsu et al. |
| 11,764,754 B2 | 9/2023 | Kawasaki |
| 12,176,298 B2* | 12/2024 | Cook ................. H01L 23/49541 |

(Continued)

FOREIGN PATENT DOCUMENTS

| CN | 111052606 A | 4/2020 |
| TW | 201407955 A | 2/2014 |

(Continued)

OTHER PUBLICATIONS

Chinese language Notice of Allowance dated Sep. 7, 2023, issued in application No. TW 111136477.

(Continued)

*Primary Examiner* — Mohsen Ahmadi
(74) *Attorney, Agent, or Firm* — McClure, Qualey & Rodack, LLP

(57) ABSTRACT

An electronic structure is provided. The electronic structure includes a substrate, a plurality of conductors, a bump structure, and a protective layer. The conductors are disposed on the substrate. The bump structure is disposed on at least one of the conductors. The protective layer is disposed on the conductors. A region is exposed between the conductors. A method of manufacturing the electronic structure is also provided.

14 Claims, 11 Drawing Sheets

(56) References Cited

U.S. PATENT DOCUMENTS

| | | | | |
|---|---|---|---|---|
| 2010/0019347 | A1* | 1/2010 | McLellan | H01G 4/33 |
| | | | | 257/532 |
| 2011/0057307 | A1* | 3/2011 | Topacio | H01L 23/49811 |
| | | | | 257/737 |
| 2011/0163440 | A1* | 7/2011 | Theuss | H01L 23/3128 |
| | | | | 257/737 |
| 2013/0175515 | A1* | 7/2013 | Ray | H10H 20/854 |
| | | | | 257/40 |
| 2014/0368084 | A1 | 12/2014 | Fukano et al. | |
| 2015/0276194 | A1* | 10/2015 | Lowenthal | H10K 59/90 |
| | | | | 362/231 |
| 2018/0023793 | A1* | 1/2018 | Lowenthal | F21V 23/06 |
| | | | | 362/296.09 |
| 2022/0069193 | A1* | 3/2022 | Yun | H03H 3/02 |

FOREIGN PATENT DOCUMENTS

| | | |
|---|---|---|
| TW | 201909458 A | 3/2019 |
| TW | 202018895 A | 5/2020 |

OTHER PUBLICATIONS

Chinese language office action dated Jul. 15, 2024, issued in application No. TW 112147180.
Chinese language Notice of Allowance dated Mar. 12, 2024, issued in application No. TW 112147180.
Chinese language Office Action dated Mar. 12, 2024, issued in application No. TW 112147180.

* cited by examiner

ELECTRONIC STRUCTURE AND METHOD OF MANUFACTURING THE SAME

BACKGROUND

Technical Field

The present disclosure relates to an electronic structure, and in particular it relates to an electronic structure with a metal protective layer under a bump.

Description of the Related Art

In conventional acoustic wave devices, since no metal line (e.g., Al, Au, or Cu) is covered by a protective layer, leakage from a Sn bump may occur during the reflow process, which may cause the Sn bump to be too thin for use in subsequent processes, such as flip-chip bonding.

BRIEF SUMMARY

In one embodiment, an electronic structure is provided. The electronic structure includes a substrate, a first conductor, a second conductor, an insulator, a protective layer and a bump structure. The first conductor is disposed on the substrate and has a first top surface and a first side surface. The second conductor is electrically connected to the first conductor and has a second top surface and a second side surface. The insulator covers the first top surface and the first side surface of the first conductor. The protective layer covers the second top surface of the second conductor. The second side surface of the second conductor is exposed. The bump structure is disposed on the second conductor. The protective layer includes a metal material.

In one embodiment, an electronic structure is provided. The electronic structure includes a substrate, a plurality of conductors, a bump structure, and a protective layer. The conductors are disposed on the substrate. The bump structure is disposed on at least one of the conductors. The protective layer is disposed on the conductors and a region is exposed between the conductors.

In one embodiment, a method of manufacturing an electronic structure is provided. The method includes the following steps. A plurality of conductors are formed on a substrate. A protective layer is formed on an exposed portion of the conductors. A region between the conductors is exposed. A bump material is reflowed to form a bump on one of the conductors.

A detailed description is given in the following embodiments with reference to the accompanying drawings.

BRIEF DESCRIPTION OF DRAWINGS

The disclosure can be more fully understood from the following detailed description when read with the accompanying figures. It is worth noting that, in accordance with standard practice in the industry, various features are not drawn to scale. In fact, the dimensions of the various features may be arbitrarily increased or reduced for clarity of discussion.

Illustrative embodiments will now be described with reference to the accompanying drawings. In the drawings, like reference numerals generally indicate identical, functionally similar, and/or structurally similar elements.

DETAILED DESCRIPTION

Figure 1:
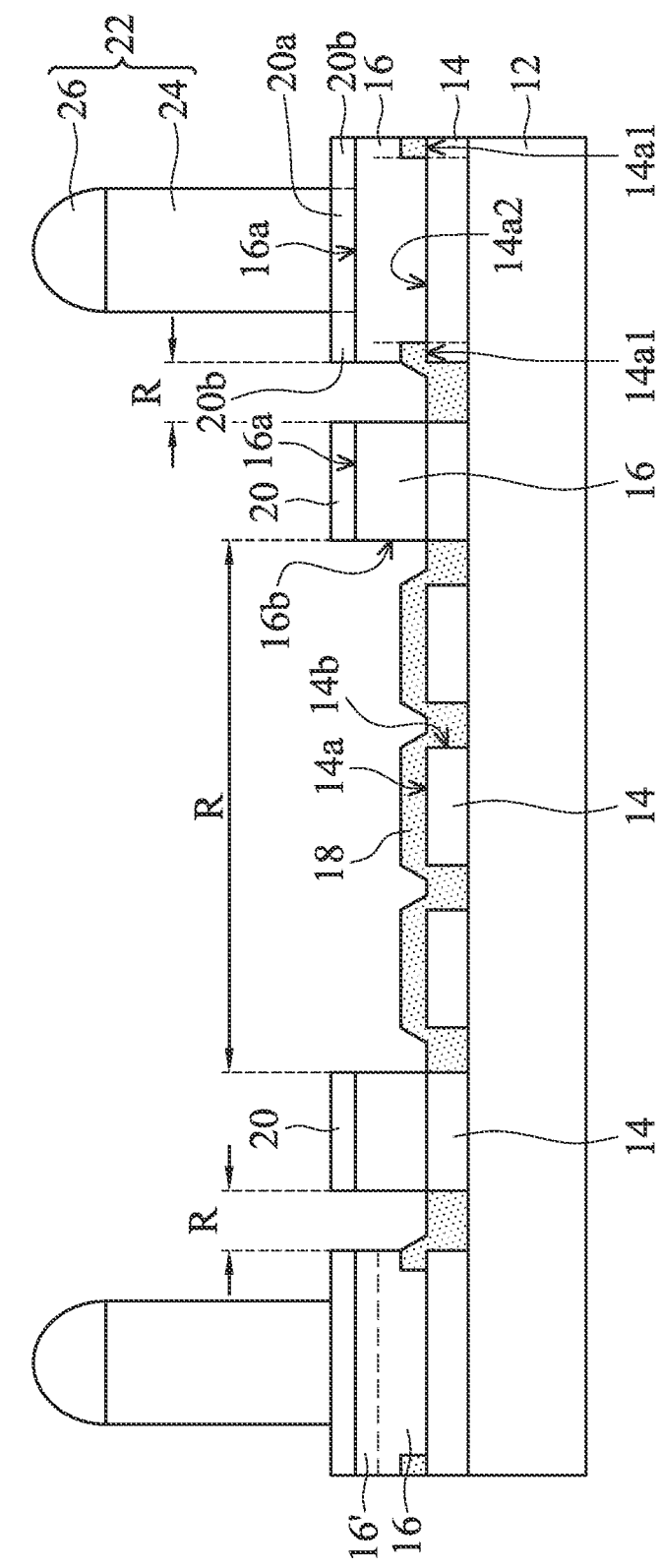
FIG. 1 is a cross-sectional view of an electronic structure, according to some embodiments of the present disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, a first feature is formed on or disposed on a second feature in the description that follows may include embodiments in which the first feature and second feature are formed or disposed in direct contact, and may also include embodiments in which additional features may be formed or disposed between the first feature and second feature, so that the first feature and second feature may not be in direct contact.

It should be understood that additional steps may be implemented before, during, or after the illustrated methods, and some steps might be replaced or omitted in other embodiments of the illustrated methods.

Furthermore, spatially relative terms, such as "beneath," "below," "lower," "on," "above," "upper" and the like, may be used herein for ease of description to describe one element or feature's relationship to other elements or features as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the present disclosure, the terms "about." "approximately" and "substantially" may mean±20%, ±10%, ±5%, ±3%, ±2%, ±1%, or ±0.5% of the stated value. The stated value of the present disclosure is an approximate value. That is, when there is no specific description of the terms "about," "approximately" and "substantially", the stated value includes the meaning of "about," "approximately" or "substantially".

Unless otherwise defined, all terms (including technical and scientific terms) used herein have the same meaning as commonly understood by one of ordinary skill in the art to which this disclosure belongs. It should be understood that terms such as those defined in commonly used dictionaries should be interpreted as having a meaning that is consistent with their meaning in the context of the prior art and will not be interpreted in an idealized or overly formal sense unless expressly so defined in the embodiments of the present disclosure.

The present disclosure may repeat reference numerals and/or letters in following embodiments. This repetition is for the purpose of simplicity and clarity and does not in itself dictate a relationship between the various embodiments and/or configurations discussed.

The present disclosure provides an electronic structure. The electronic structure may include a substrate, a first conductor, a second conductor, an insulator, a protective layer and a bump structure. The first conductor is disposed on the substrate. The second conductor may be electrically connected to the first conductor. The insulator may cover the top surface and/or the side surface of the first conductor. The protective layer may cover the top surface of the second conductor. The side surface of the second conductor may be exposed. The bump structure may be disposed on the second conductor. The protective layer may include a metal material or a dielectric material. The protective layer can reduce the leakage of the bump material (e.g. Sn) from the bump structure during a reflow process, so that an sufficient bump thickness can be maintained to facilitate flip-chip bonding.

FIG. 1 is a cross-sectional view of an electronic structure 10, according to some embodiments of the present disclosure.

As shown in FIG. 1, the electronic structure 10 may include a substrate 12, a plurality of first conductors 14, a plurality of second conductors 16, an insulator 18, a protective layer 20 and a bump structure 22. The first conductor 14 is disposed on the substrate 12. The first conductor 14 has a top surface 14a and a side surface 14b. The second conductor 16 may be disposed on the substrate 12 and electrically connected to the first conductor 14. For example, the second conductor 16 may be disposed on the first conductor 14. The second conductor 16 has a top surface 16a and a side surface 16b. The insulator 18 may cover the top surface 14a and the side surface 14b of the first conductor 14. The protective layer 20 may be disposed on the second conductor 16 and cover the top surface 16a of the second conductor 16. The side surface 16b of the second conductor 16 may be exposed. The bump structure 22 may be disposed on the second conductor 16. The protective layer 20 may include a metal material or a dielectric material, but not limited thereto.

In some embodiments, the substrate 12 may be, for example, a wafer or a chip, but the present disclosure is not limited thereto. In some embodiments, the substrate 12 may include a semiconductor substrate, a ceramic substrate, a glass substrate, a polymer substrate, other applicable substrates, or a combination thereof, but the present disclosure is not limited thereto. In some embodiments, the material of the semiconductor substrate may include an elemental semiconductor (such as silicon (Si) and/or germanium (Ge)), a compound semiconductor (such as gallium nitride (GaN), silicon carbide (SiC), gallium arsenide (GaAs), gallium phosphide (GaP), indium phosphide (InP), indium arsenide (InAs), indium antimonide (InSb), lithium tantalum oxide (LiTaO$_3$) and/or lithium niobium oxide (LiNbO$_3$)), an alloy semiconductor (such as silicon germanium (SiGe) alloy, gallium arsenide phosphide (GaAsP) alloy, aluminum indium arsenide (AlInAs) alloy, aluminum gallium arsenide (AlGaAs) alloy, gallium indium arsenide (GaInAs) alloy, gallium indium phosphide (GaInP) alloy, and/or gallium indium arsenide phosphide (GaInAsP) alloy), other applicable semiconductor materials, or a combination thereof, but the present disclosure is not limited thereto. In some embodiments, the substrate 12 may be a piezoelectric substrate (such as LiTaO$_3$, LiNbO$_3$, or quartz substrate) applied in, for example, an acoustic wave device, such as a surface acoustic wave (SAW) device or a bulk acoustic wave device (BAW), but not limited thereto.

In some embodiments, the substrate 12 may include a semiconductor on insulator (SOI) substrate. The SOI substrate may include a base plate, an insulating layer (e.g. a buried oxide layer, a nitride layer or other suitable dielectric layers) disposed on the base plate, and a semiconductor layer (e.g. the aforementioned elemental semiconductor or the compound semiconductor) disposed on the insulating layer.

In some embodiments, the substrate 12 may be a composite substrate including additional components (not shown for simplicity), such as thin-film transistors (TFT), complementary metal-oxide semiconductors (CMOS), driving components, suitable conductive features, the like, or a combination thereof, but the present disclosure is not limited thereto. The conductive features may include cobalt (Co), ruthenium (Ru), aluminum (Al), tungsten (W), copper (Cu), titanium (Ti), tantalum (Ta), silver (Ag), gold (Au), platinum (Pt), nickel (Ni), zinc (Zn), chromium (Cr), molybdenum (Mo), niobium (Nb), the like, a combination thereof, or the multiple layers thereof, but the present disclosure is not limited thereto. These components may provide circuitry that connects to the components on the substrate 12.

In some embodiments, the material of the first conductor 14 may include metal or metal alloy such as molybdenum (Mo), tungsten (W), tungsten silicide (WSi), titanium (Ti), titanium tungsten (TiW), iridium (Ir), palladium (Pd), platinum (Pt), nickel (Ni), cobalt (Co), chromium (Cr), ruthenium (Ru), osmium (Os), rhodium (Rh), tantalum (Ta), tantalum nitride (TaN), aluminum (Al), copper (Cu), gold (Au), aluminum copper (AlCu), rhenium (Re), other applicable conductive materials, or a combination thereof, but the present disclosure is not limited thereto. In some embodiments, the first conductor 14 may be an interdigital transducer (IDT) layer applied in, for example, an acoustic wave device.

In some embodiments, the material of the second conductor 16 may include metal or metal alloy such as molybdenum (Mo), tungsten (W), tungsten silicide (WSi), titanium (Ti), tungsten titanium (TiW), iridium (Ir), palladium (Pd), platinum (Pt), nickel (Ni), cobalt (Co), chromium (Cr), ruthenium (Ru), osmium (Os), rhodium (Rh), tantalum (Ta), tantalum nitride (TaN), aluminum (Al), copper (Cu), gold (Au), aluminum copper (AlCu), rhenium (Re), other applicable conductive materials, or a combination thereof, but the present disclosure is not limited thereto. In some embodiments, the second conductor 16 may include a single layer or multiple layers. In some embodiments, as shown in FIG. 1, the material of the top portion 16' of the second conductor 16 may include, for example, Al, Au, or Cu that may be easily alloyed with Sn. For example, when the second conductor 16 includes multiple layers, the top portion 16' may refer to the top layer or the top two layers of the second conductor 16, but not limited thereto. In some embodiments, the second conductor 16 may be a redistribution layer. In some embodiments, the first conductor 14 may be in contact with the second conductor 16. In some embodiments, the first conductor 14 may be in direct contact with the second conductor 16, as shown in FIG. 1. In some embodiments, the first conductor 14 may be not in direct contact with the second conductor 16.

In some embodiments, the material of the insulator 18 may include organic insulating materials or inorganic insulating materials (such as oxide (e.g. silicon oxide (SiO$_x$)), nitride (e.g. silicon nitride ($SiN_y$)), or oxynitride (e.g. silicon oxynitride (SiON))), other applicable insulating materials, or a combination thereof, but the present disclosure is not limited thereto. In some embodiments, the insulator 18 may cover a first portion 14a1 of the top surface 14a, and a second portion 14a2 of the top surface 14a of the first conductor 14 is exposed from the insulator 18, as shown in FIG. 1.

In some embodiments, the material of the protective layer 20 may include metal (such as titanium (Ti), titanium tungsten (TiW) or platinum (Pt)), dielectric layer (such as $SiN_x$ or $SiO_y$), other applicable materials that may be not easily alloyed with the material of the bump 26 (e.g. Sn, Pb, Au, or Ag), or a combination thereof, but the present disclosure is not limited thereto. In some embodiments, the protective layer 20 may be disposed on the second conductors 16, and a region R between the second conductors 16 is exposed from the protective layer 20.

In some embodiments, the bump structure 22 may include a pillar-like conductor 24 and/or a bump 26, but not limited thereto. The bump 26 may be disposed on the pillar-like conductor 24, as shown in FIG. 1. In some embodiments, the material of the pillar-like conductor 24 may include metal or metal alloy, such as copper (Cu), gold (Au), copper nickel gold (CuNiAu), other applicable conductive materials, or a combination thereof, but the present disclosure is not limited thereto. In some embodiments, the material of bump 26 may include metal (e.g. Sn, Au, Ag, or Pb), metal alloy (e.g. the alloy of the aforementioned metal), other applicable materials, or a combination thereof, but the present disclosure is not limited thereto. In some embodiments, the bump structure 22 may be disposed on at least one of the second conductors 16. The number of the bump structure 22 disposed on the second conductors 16 is variable according to the requirements of the products, for example, two or more. In some embodiments, a portion of the protective layer 20 is disposed between the second conductor 16 and the bump structure 22. In some embodiments, a first portion 20a of the protective layer 20 may overlap the bump structure 22, and a second portion 20b of the protective layer 20 does not overlap the bump structure 22, as shown in FIG. 1.

In some embodiments, the alloy temperature of the protective layer 20 and the bump 26 may be greater than 500° C., such as 600° C. or 700° C. In some embodiments, the alloy temperature of the protective layer 20 and the bump 26 may be greater than 800° C., such as 900° C. or 1100° C., but not limited thereto. In some embodiments, the alloy temperature of the material of the top portion 16' of the second conductor 16 and the bump 26 may be less than 500° C., such as 400° C. In some embodiments, the alloy temperature of the material of the top portion 16' of the second conductor 16 and the bump 26 may be less than 300° C., such as 150° C. or 200° C. In some embodiments, the ratio of the area of all the bump structures 22 in the electronic structure 10 to the area of the top surface 16a of the plurality of the second conductors 16 in the electronic structure 10 may be ranged from 5% to 60%, such as 10%, 20%, 30%, 40% or 50%, but not limited thereto. The areas may be measured from the top view by using measuring tools or measured from the designed layout. The alloy temperature may be defined as the temperature that the metal components can form the alloy. The alloy temperature may be obtained from phase diagram, but not limited thereto.

Figure 2:
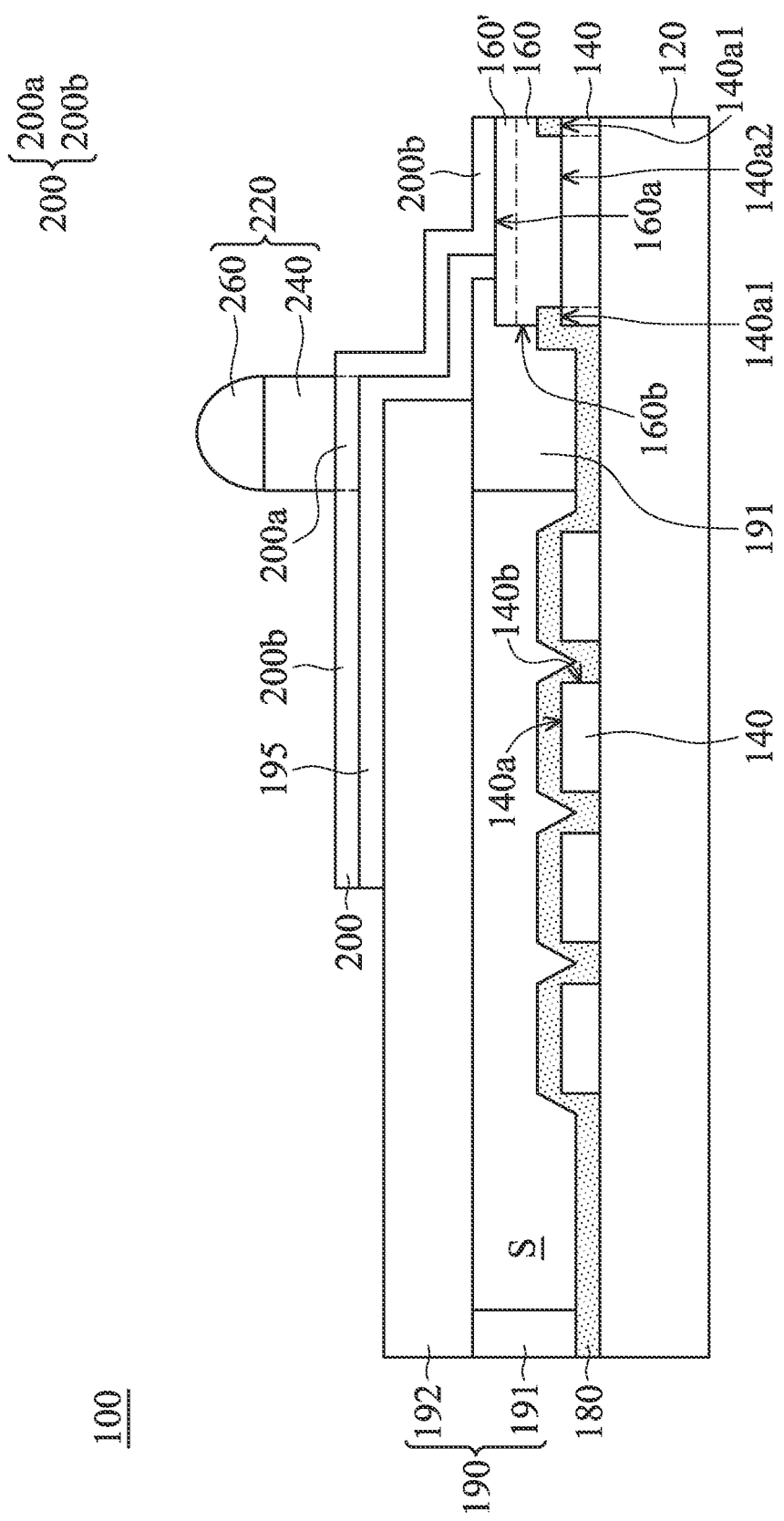
FIG. 2 is a cross-sectional view of an electronic structure, according to some embodiments of the present disclosure.

FIG. 2 is a cross-sectional view of an electronic structure 100, according to some embodiments of the present disclosure.

As shown in FIG. 2, the electronic structure 100 may include a substrate 120, a plurality of electrodes 140, a plurality of conductors 160, an insulator 180, a cover 190, a conductive layer 195, a protective layer 200 and a bump structure 220. The electrode 140 is disposed on the substrate 120. The electrode 140 has a top surface 140a and a side surface 140b. The conductor 160 may be disposed on the substrate 120 and electrically connected to the electrode 140. The conductor 160 has a top surface 160a and a side surface 160b. The insulator 180 may cover the top surface 140a and the side surface 140b of the electrode 140. The cover 190 may be disposed on the electrode 140, and a space S on the electrode 140 may be formed. The conductive layer 195 may be electrically connected to the conductor 160 and may extend onto the cover 190. The protective layer 200 may be disposed on the conductor 160 and may cover the top surface 160a of the conductor 160. The side surface 160b of the conductor 160 may be exposed from the protective layer 200. The bump structure 220 may be disposed on the cover 190 and the conductor 160. The protective layer 200 may include a metal material or a dielectric material.

In some embodiments, the substrate 120 may be similar to the aforementioned substrate 12, and thus it will not be repeated hereinafter.

In some embodiments, the material of the electrode 140 may be similar to the material of the first conductor 14, and thus it will not be repeated hereinafter.

In some embodiments, the material of the conductor 160 may be similar to the second conductor 16, and thus it will not be repeated hereinafter. In some embodiments, the conductor 160 may be a redistribution layer. In some embodiments, the electrode 140 may be in contact with the conductor 160. In some embodiments, the electrode 140 may be in direct contact with the conductor 160, as shown in FIG. 2. In some embodiments, the electrode 140 may be not in direct contact with the conductor 160.

In some embodiments, the material of the insulator 180 may be similar to the material of the insulator 18, and thus it will not be repeated hereinafter. In some embodiments, the insulator 180 may cover a first portion 140a1 of the top surface 140a, and a second portion 140a2 of the top surface 140a of the electrode 140 may be exposed from the insulator 180, as shown in FIG. 2.

In some embodiments, the cover 190 may include a wall 191 and a roof 192 disposed on the wall 191. In some embodiments, the material of the wall 191 may be the same as that of the roof 192. In some embodiments, the material of the wall 191 may be different from that of the roof 192. In some embodiments, the material of the wall 191 and the roof 192 may include photo-resist, epoxy, resin, polymers, other applicable materials, or a combination thereof, but the present disclosure is not limited thereto.

In some embodiments, the material of the conductive layer 195 may include metal or alloy, such as molybdenum (Mo), tungsten (W), tungsten silicide (WSi), titanium (Ti), tungsten titanium (TiW), iridium (Ir), palladium (Pd), platinum (Pt), nickel (Ni), cobalt (Co), chromium (Cr), ruthenium (Ru), osmium (Os), rhodium (Rh), tantalum (Ta), tantalum nitride (TaN), aluminum (Al), copper (Cu), gold (Au), aluminum copper (AlCu), rhenium (Re), other applicable conductive materials, or a combination thereof, but the present disclosure is not limited thereto.

In some embodiments, the material of the protective layer 200 may include metal (e.g. titanium (Ti), titanium tungsten (TiW) or platinum (Pt)) or dielectric material (e.g. oxide, nitride or oxynitride), other applicable materials that are not easily alloyed with the material of the bump 260, or a combination thereof, but the present disclosure is not limited thereto.

In some embodiments, the bump structure 220 may include a pillar-like conductor 240 and/or a bump 260. The bump 26 may be disposed on the pillar-like conductor 240, as shown in FIG. 2. In some embodiments, the material of the pillar-like conductor 240 may include copper (Cu), gold (Au), copper nickel gold (CuNiAu), other applicable conductive materials, or a combination thereof, but the present disclosure is not limited thereto. In some embodiments, the material of bump 260 may include metal (e.g. Sn. Au, Ag, or Pb), metal alloy (e.g. the alloy of the aforementioned metal), other applicable materials, or a combination thereof, but the present disclosure is not limited thereto. In some embodiments, the bump structure 220 may be disposed on at least one of the conductors 160. The number of the bump structure 220 disposed on the conductors 160 is variable according to the requirements of the products, for example, two or more. In some embodiments, a portion of the protective layer 200 may be disposed between the conductor 160 and the bump structure 220. In some embodiments, a first portion 200a of the protective layer 200 may overlap the bump structure 220, and a second portion 200b of the protective layer 200 may not overlap the bump structure 220, as shown in FIG. 2.

In some embodiments, the alloy temperature of the protective layer 200 and the bump 260 may be greater than 500° C. In some embodiments, the alloy temperature of the protective layer 200 and the bump 260 may be greater than 800° C. In some embodiments, the alloy temperature of the material of the top portion 160' of the conductor 160 and the bump 260 may be less than 500° C. In some embodiments, the alloy temperature of the material of the top portion 160' of the second conductor 160 and the bump 260 may be less than 300° C. In some embodiments, the ratio of the area of all the bump structures 220 in the electronic structure 100 to the area of the top surface 160a of the plurality of the conductors 160 in the electronic structure 100 may be ranged from 5% to 60%, such as 10%, 20%, 30%, 40% or 50%, but not limited thereto.

Figure 3:
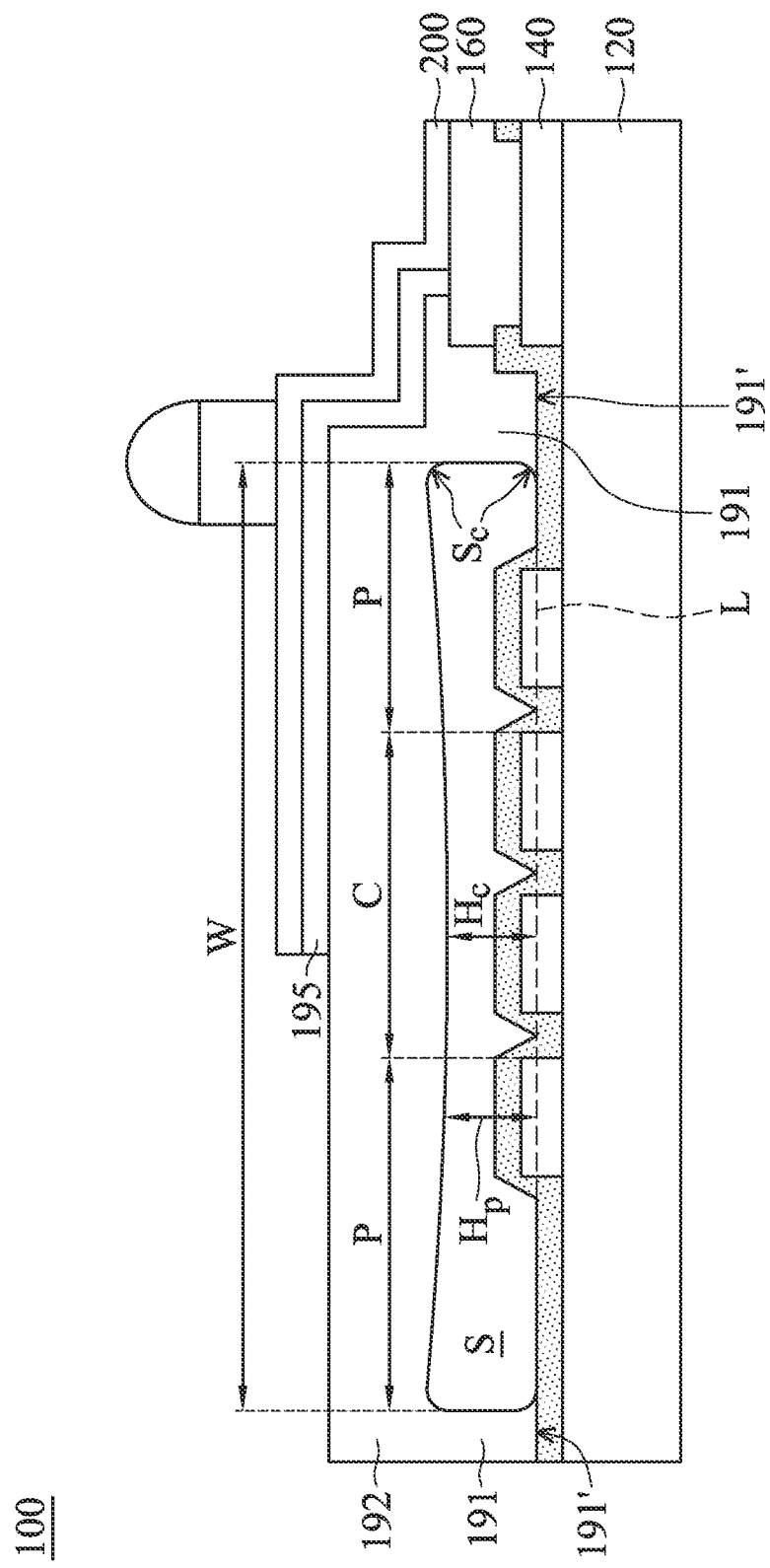
FIG. 3 is a cross-sectional view of an electronic structure, according to some embodiments of the present disclosure.

FIG. 3 is a cross-sectional view of an electronic structure 100, according to some embodiments of the present disclosure.

The profile and a dimension of the space S formed in the electronic structure 100 are described in further detail. In FIG. 3, the height He in the central region C of the space S may be less than the height Hp in the peripheral region P of the space S, but not limited thereto. For example, the width of the space S may be defined as W. The width W may be the minimum width of the space S, but not limited thereto. The region accounting for 40% of the width W and located in the central portion of the space S may be defined as a central region C of the space S. The respective regions accounting for 30% of the width W and located on the both sides of the central region C may be defined as peripheral regions P of the space S. The dotted line L may be a connecting line between the bottom surfaces 191' of the walls 191 on the both sides of the space S as a reference line, but not limited thereto. The minimum height between the dotted line L and the roof 192 within the central region C may be defined as Hc. The minimum height between the dotted line L and the roof 192 within the peripheral region P may be defined as Hp. The profile and dimension of the space S are described as follows. The least one of the corners Sc of the space S may be arc-shaped or may have a curved profile. For example, the top corners Sc may have a curved profile while the bottom corners Sc may not have curved profile, but not limited thereto. The minimum height He between the dotted line L and the roof 192 within the central region C may be less than the minimum height Hp between the dotted line L and the roof 192 within the peripheral region P. In other embodiments, the minimum distance between the electrode 140 and the roof 192 in the central region C may be less than the minimum distance between the electrode 140 and the roof 192 in the peripheral region P, but not limited thereto.

In some embodiments, the space S may be inversely tapered. For example, the top width of the space S may be less than the bottom width of the space S. The minimum width of the top half portion of the space S may be less than the minimum width of the bottom half portion of the space S, but not limited thereto.

FIGS. 4A to 4F are cross-sectional views of a method of manufacturing an electronic structure 10, according to some embodiments of the present disclosure.

Figure 4A:
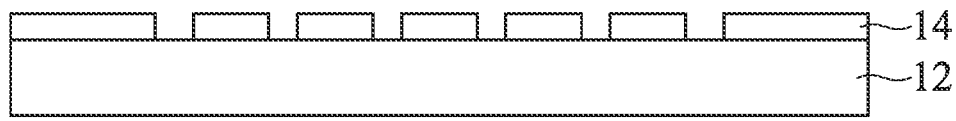
FIGS. 4A to 4F are cross-sectional views of a method of manufacturing an electronic structure, according to some embodiments of the present disclosure.

As shown in FIG. 4A, a substrate 12 is provided. A plurality of first conductors 14 may be formed on the substrate 12. In some embodiments, the first conductors 14 may be formed by a deposition process followed by a patterning process. In some embodiments, the deposition process may include electroplating, sputtering, resistive heating evaporation, physical vapor deposition (PVD), chemical vapor deposition (CVD), atomic layer deposition (ALD), other applicable processes, or a combination thereof, but the present disclosure is not limited thereto. In some embodiments, the patterning process may include a photolithography process, an etching process, other applicable processes, or a combination thereof, but the present disclosure is not limited thereto.

Figure 4B:
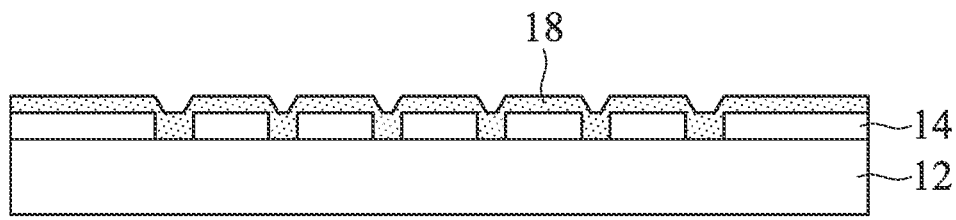

As shown in FIG. 4B, an insulator 18 may be formed on the first conductors 14 and may be filled between the first conductors 14. In some embodiments, the insulator 18 may be formed by, for example, low-pressure chemical vapor deposition (LPCVD), plasma enhanced chemical vapor deposition (PECVD), atomic layer deposition (ALD), evaporation, other applicable processes, or a combination thereof, but the present disclosure is not limited thereto.

Figure 4C:
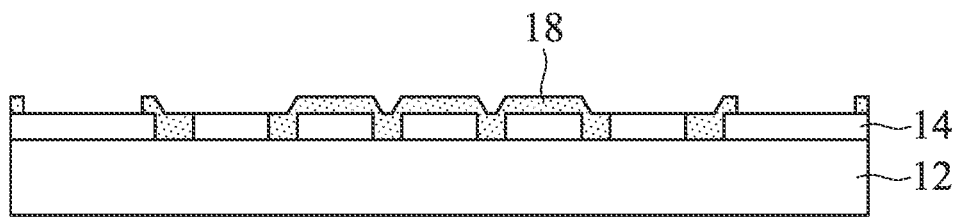

As shown in FIG. 4C, the insulator 18 may be patterned to expose a portion of the first conductors 14. In some embodiments, the insulator 18 may be patterned by an etching process. In some embodiments, the etching process may be a dry etching process or a wet etching process, other applicable processes, or a combination thereof, but the present disclosure is not limited thereto.

Figure 4D:
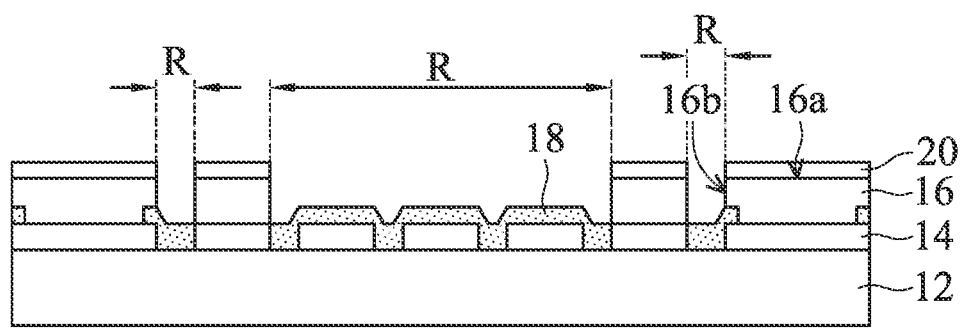

As shown in FIG. 4D, a plurality of second conductors 16 may be formed on the exposed first conductors 14. A protective layer 20 may be formed on the second conductors 16, and a region R between the second conductors 16 is exposed. The protective layer 20 may cover the top surface 16a of the second conductor 16. The side surface 16b of at least one of the second conductors 16 may be exposed. In some embodiments, the second conductors 16 and the protective layer 20 may be formed by a deposition process followed by a patterning process. In some embodiments, the deposition process may include electroplating, sputtering, resistive heating evaporation, physical vapor deposition (PVD), chemical vapor deposition (CVD), atomic layer deposition (ALD), other applicable processes, or a combination thereof, but the present disclosure is not limited thereto. In some embodiments, the patterning process may include a photolithography process, an etching process, other applicable processes, or a combination thereof, but the present disclosure is not limited thereto.

Figure 4E:
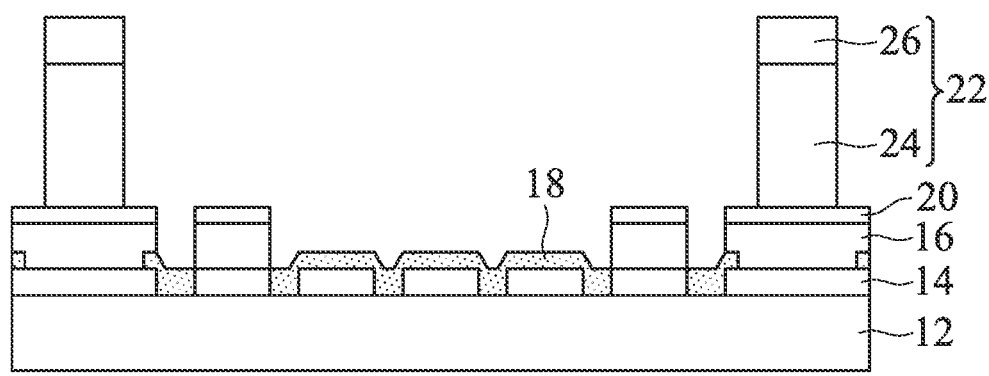

As shown in FIG. 4E, a bump structure 22 may be formed on a portion of the second conductors 16. The bump structure 22 may include a pillar-like conductor 24 and/or a bump 26. In some embodiments, the bump structure 22 may be formed by electroplating, solder paste transfer, evaporation, other applicable processes, or a combination thereof, but the present disclosure is not limited thereto.

Figure 4F:
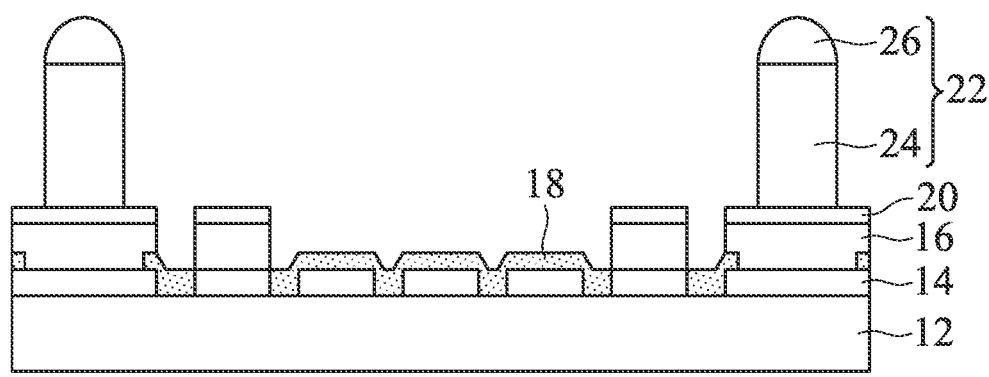

As shown in FIG. 4F, a reflow process may be performed. In the reflow process, the bump 26 of the bump structure 22 may be melted by heating to form the bump 26 with an appropriate shape and thickness to facilitate subsequent flip-chip bonding, but not limited thereto. In some embodiments, the alloy temperature of the protective layer 20 and the bump 26 may be greater than the processing temperature of the reflow process, but not limited thereto. FIGS. 5A to 5E are cross-sectional views of a method of manufacturing an electronic structure 100, according to some embodiments of the present disclosure.

Figure 5A:
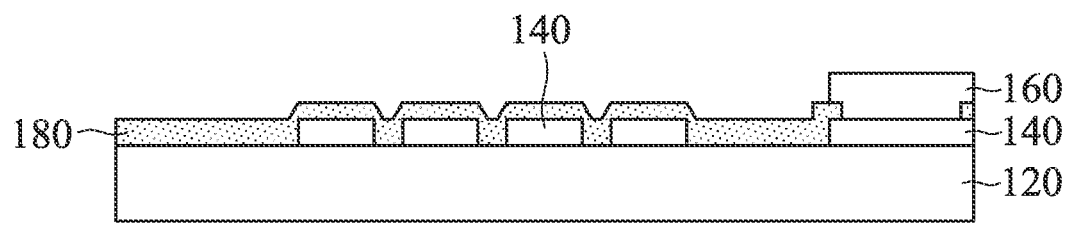
FIGS. 5A to 5E are cross-sectional views of a method of manufacturing an electronic structure, according to some embodiments of the present disclosure.

As shown in FIG. 5A, a substrate 120 is provided. A plurality of electrodes 140 may be formed on the substrate 120. An insulator 180 may be formed on the electrodes 140 and may be filled between the electrodes 140. The insulator 180 may be patterned to expose a portion of the electrodes 140. A plurality of conductors 160 may be formed on the exposed electrodes 140. In some embodiments, the electrodes 140 and the conductors 160 may be formed by a deposition process followed by a patterning process. In some embodiments, the deposition process may include electroplating, sputtering, resistive heating evaporation, physical vapor deposition (PVD), chemical vapor deposition (CVD), atomic layer deposition (ALD), other applicable processes, or a combination thereof, but the present disclosure is not limited thereto. In some embodiments, the patterning process may include a photolithography process, an etching process, other applicable processes, or a combination thereof, but the present disclosure is not limited thereto. In some embodiments, the insulator 180 may be formed by low-pressure chemical vapor deposition (LPCVD), plasma enhanced chemical vapor deposition (PECVD), atomic layer deposition (ALD), evaporation, other applicable processes, or a combination thereof, but the present disclosure is not limited thereto. In some embodiments, the insulator 180 may be patterned by an etching process. In some embodiments, the etching process may be a dry etching process or a wet etching process, other applicable processes, or a combination thereof, but the present disclosure is not limited thereto.

Figure 5B:
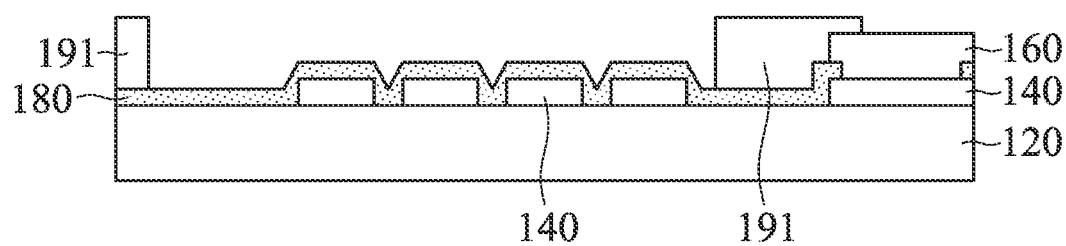

As shown in FIG. 5B, a wall 191 is formed on the insulator 180 and a portion of the conductors 160. In some embodiments, the wall 191 may be formed by spin coating, spray coating, thermal vapor deposition (TVD), film lamination, other applicable processes, or a combination thereof, but the present disclosure is not limited thereto, followed by a patterning process. In some embodiments, the patterning process may include a photolithography process, an etching process, other applicable processes, or a combination thereof, but the present disclosure is not limited thereto.

Figure 5C:
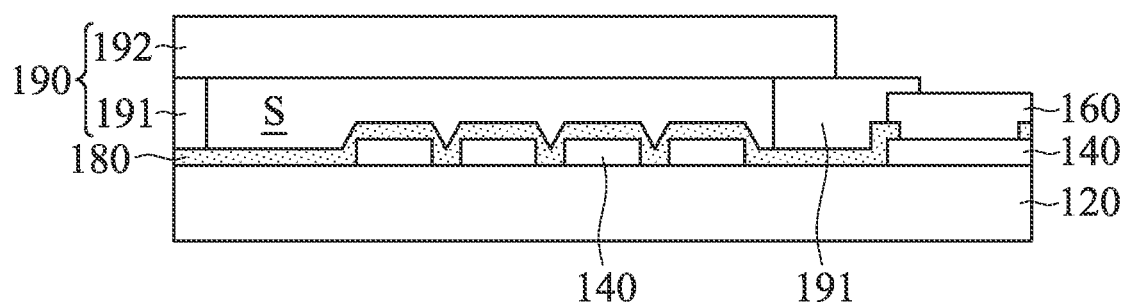

As shown in FIG. 5C, a roof 192 may be formed on the wall 191 to form a cover 190, and a space S on the electrodes 140 is formed. In some embodiments, the roof 192 may be formed by spin coating, spray coating, thermal vapor deposition (TVD), film lamination, other applicable processes, or a combination thereof, but the present disclosure is not limited thereto, followed by a patterning process. In some embodiments, the patterning process may include a photolithography process, an etching process, other applicable processes, or a combination thereof, but the present disclosure is not limited thereto.

Figure 5D:
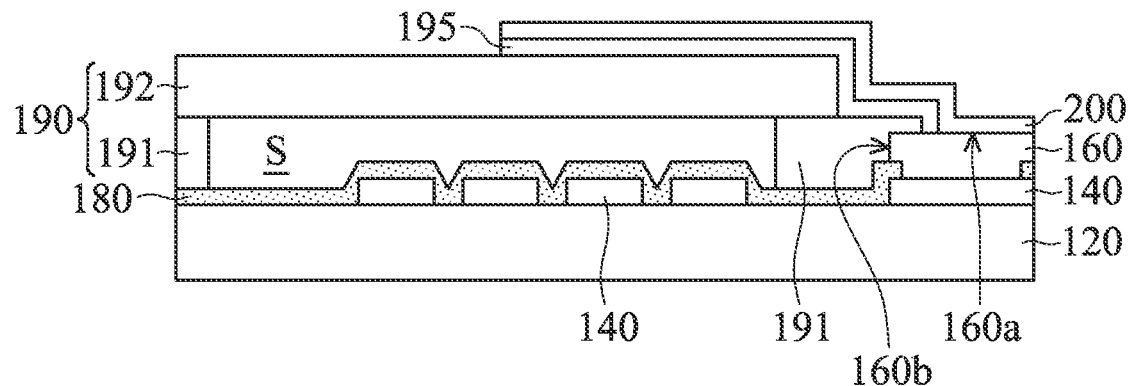

As shown in FIG. 5D, a conductive layer 195 may be formed on the cover 190 and may be electrically connected to the conductor 160. A protective layer 200 may be formed on the conductive layer 195 and may cover the top surface 160a of the conductor 160. The side surface 160b of the conductor 16) may be exposed from the protective layer 200. In some embodiments, the conductive layer 195 and the protective layer 200 may be formed by a deposition process followed by a patterning process. In some embodiments, the deposition process may include electroplating, sputtering, resistive heating evaporation, physical vapor deposition (PVD), chemical vapor deposition (CVD), atomic layer deposition (ALD), other applicable processes, or a combination thereof, but the present disclosure is not limited thereto. In some embodiments, the patterning process may include a photolithography process, an etching process, other applicable processes, or a combination thereof, but the present disclosure is not limited thereto.

Figure 5E:
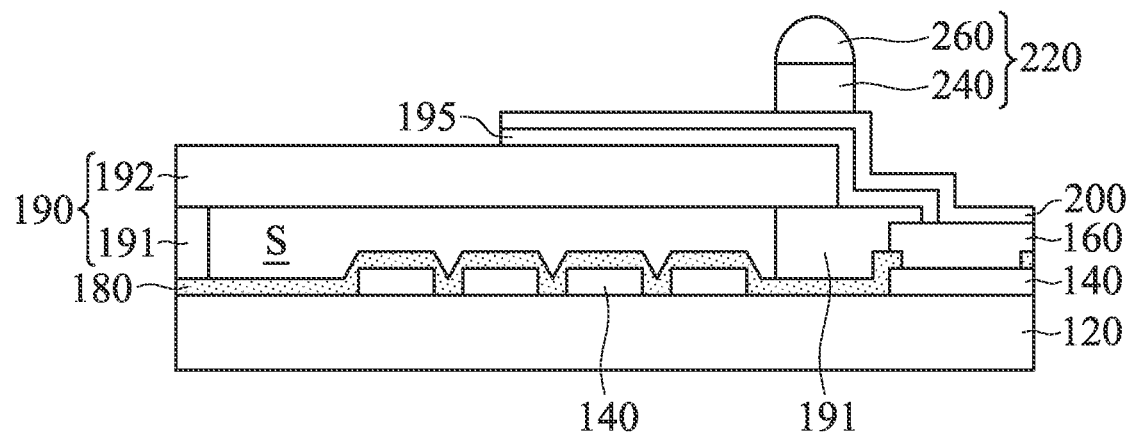

As shown in FIG. 5E, a bump structure 220 may be formed on the cover 190 and/or the conductor 160. The bump structure 220 may include a pillar-like conductor 240 and/or a bump 260. A reflow process may be performed. In some embodiments, the bump structure 220 may be formed by electroplating, solder paste transfer, evaporation, other applicable processes, or a combination thereof, but the present disclosure is not limited thereto. In the reflow process, the bump 260 of the bump structure 220 may be melted by heating to form the bump 260 with an appropriate shape and thickness to facilitate subsequent flip-chip bonding. In some embodiments, the alloy temperature of the protective layer 200 and the bump 260 may be greater than the process temperature of the reflow process.

Figure 6:
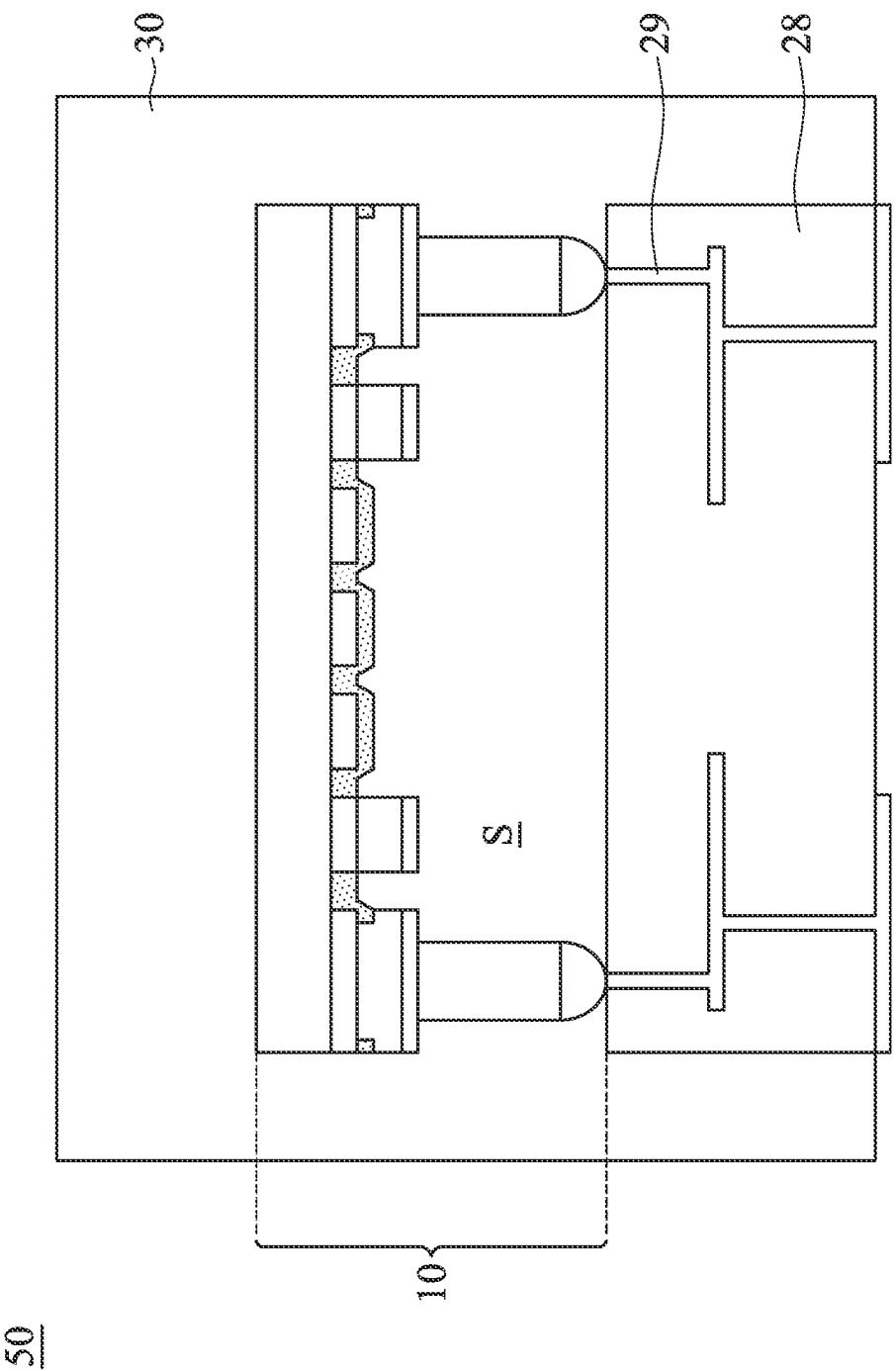
FIG. 6 is a cross-sectional view of a package structure, according to some embodiments of the present disclosure.

FIG. 6 is a cross-sectional view of a package structure 50, according to some embodiments of the present disclosure.

The package structure 50 may include the electronic structure 10 (e.g., with chip level), a backplane 28, and an encapsulation material 30. In some embodiments, the backplane 28 may include a printed circuit board (PCB) with a circuitry 29, but the present disclosure is not limited thereto. In FIG. 6, the electronic structure 10 may be bonded to the backplane 28 by a flip-chip manner to form a space S between the electronic structure 10 and the backplane 28. The encapsulation material 30 may cover the electronic structure 10 and the backplane 28.

Figure 7:
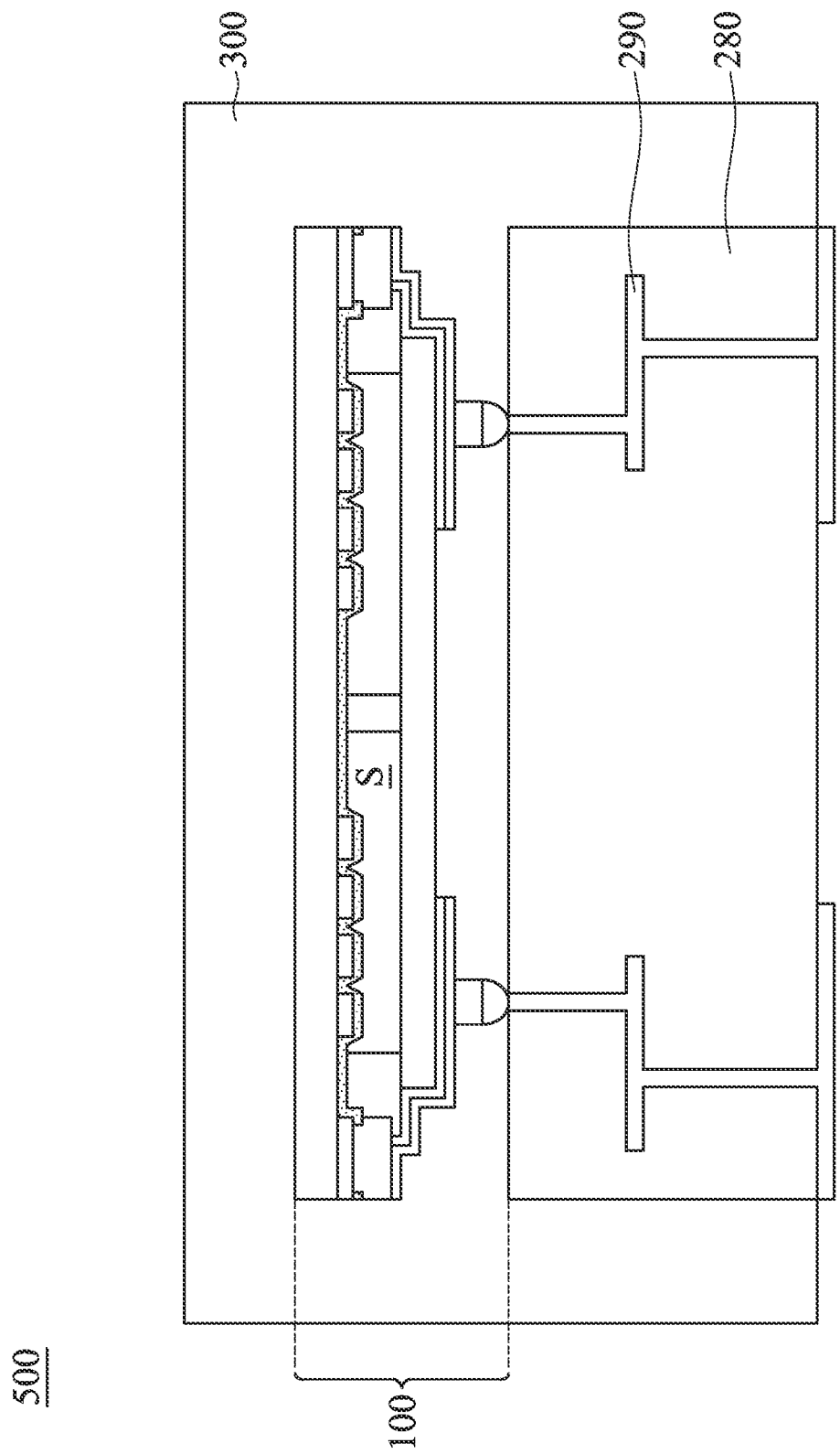
FIG. 7 is a cross-sectional view of a package structure, according to some embodiments of the present disclosure.

FIG. 7 is a cross-sectional view of a package structure 500, according to some embodiments of the present disclosure.

The package structure 500 may include the electronic structure 100, a backplane 280, and an encapsulation material 300. The package structure 500 may be wafer level packaged. In some embodiments, the backplane 280 may include a printed circuit board (PCB) with a circuitry 290, but the present disclosure is not limited thereto. In FIG. 7, the electronic structure 100 having the space S may be bonded to the backplane 280 by a flip-chip manner. The encapsulation material 300 may cover the electronic structure 100 and the backplane 280.

Figure 8:
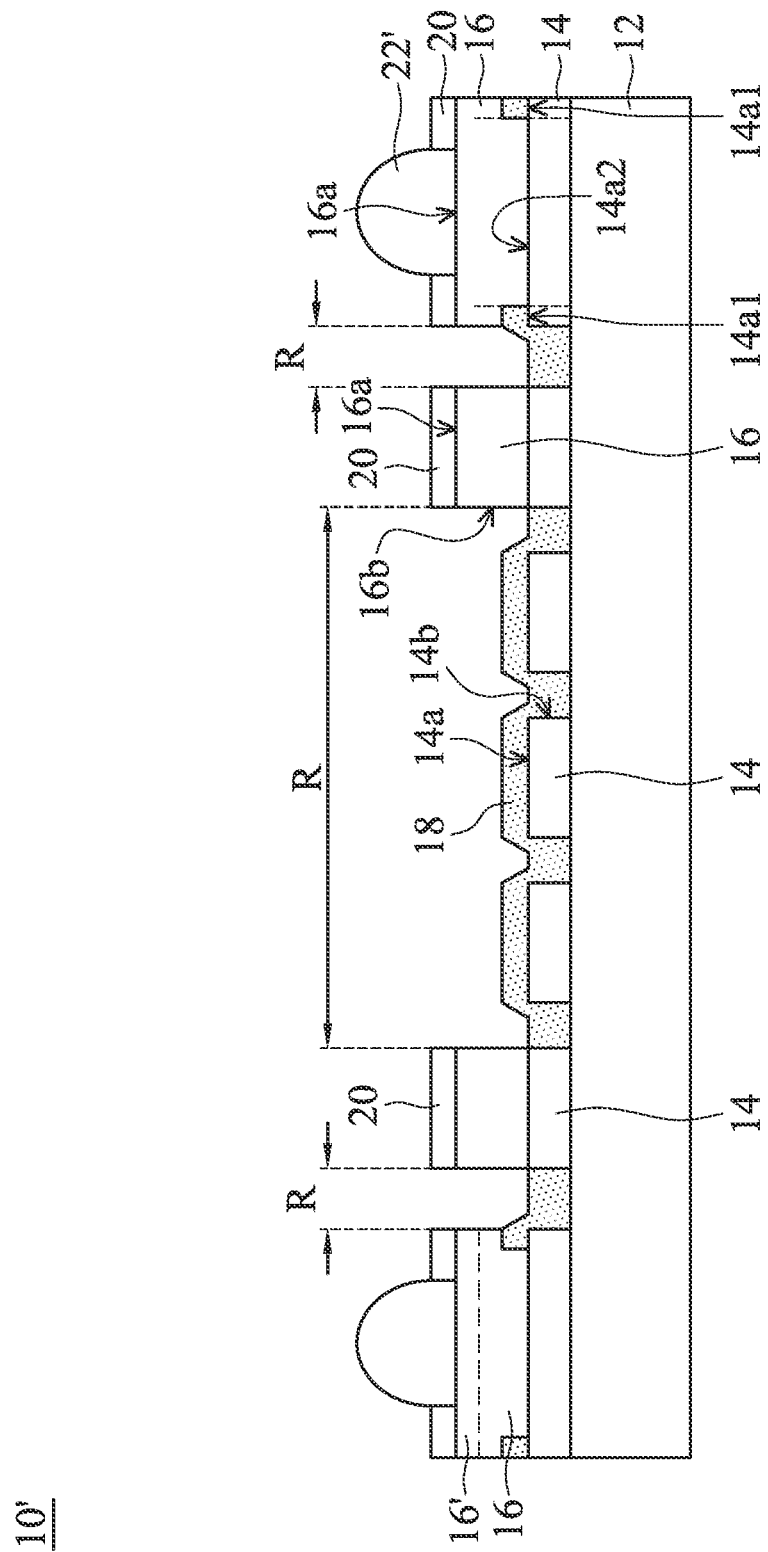
FIG. 8 is a cross-sectional view of an electronic structure, according to some embodiments of the present disclosure.

FIG. 8 is a cross-sectional view of an electronic structure 10', according to some embodiments of the present disclosure. The electronic structure 10' is similar to the electronic structure 10 in FIG. 1. The major difference between the electronic structure 10' and the electronic structure 10 is that the bump structure 22' in FIG. 8 may be in contact with the second conductor 16. That is, the protection layer 20 in FIG. 8 may not overlap the bump structure 22' in the normal direction of the substrate 12. The bump structure 22' may include a pillar-like conductor and/or a bump. For example, the bump structure 22' may include a bump (e.g. a solder bump) in contact with the second conductor 16, but not limited thereto.

Figure 9:
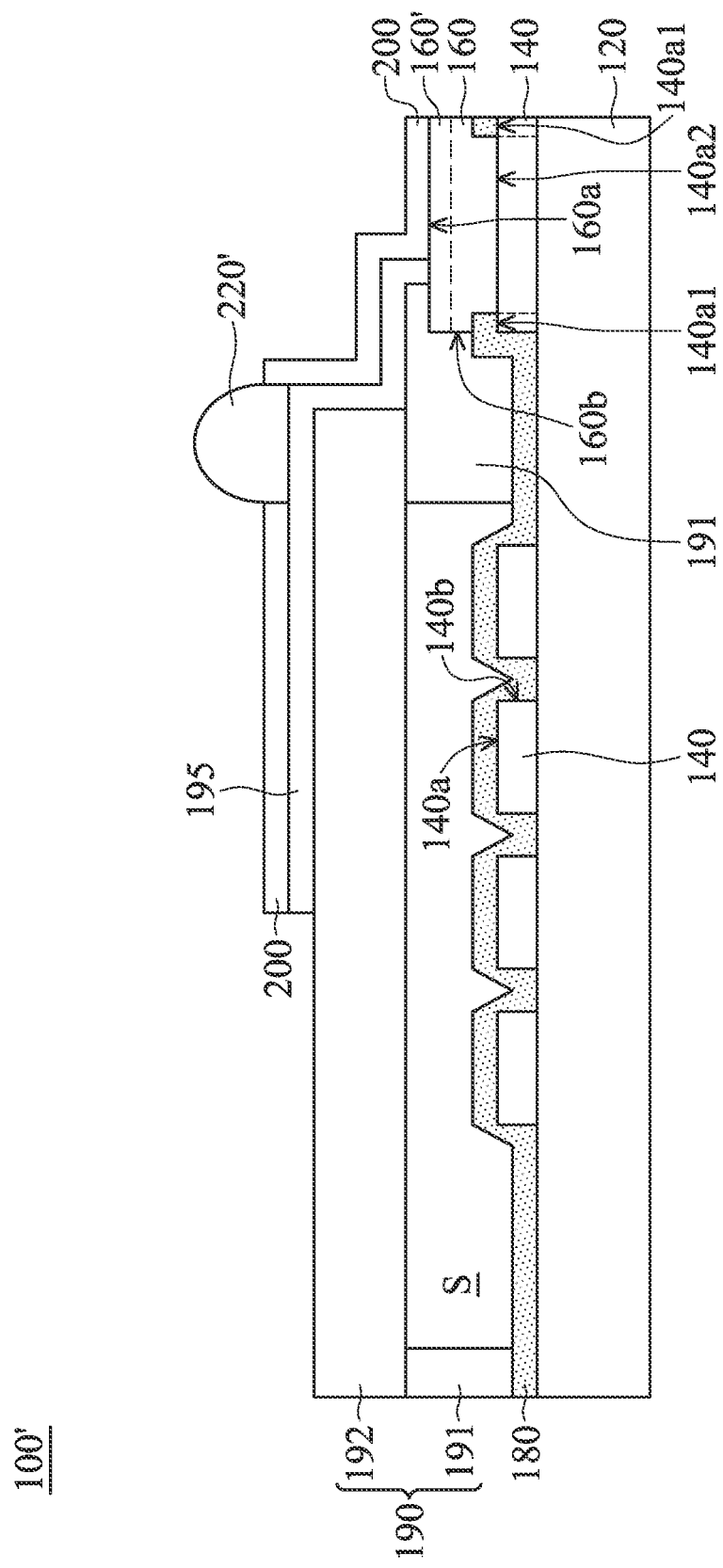
FIG. 9 is a cross-sectional view of an electronic structure, according to some embodiments of the present disclosure.

FIG. 9 is a cross-sectional view of an electronic structure 100', according to some embodiments of the present disclosure. The electronic structure 100' is similar to the electronic structure 100 in FIG. 2. The major difference between the electronic structure 100' and the electronic structure 100 is that the bump structure 220' in FIG. 9 may be in contact with the conductive layer 195. That is, the protection layer 200 in FIG. 9 may not overlap the bump structure 220' in the normal direction of the substrate 120. The bump structure 220' may include a pillar-like conductor and/or a bump. For example, the bump structure 220' may include a bump (e.g. a solder bump) in contact with the conductive layer 195, but not limited thereto.

The foregoing outlines features of several embodiments so that those skilled in the art will better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure. Therefore, the scope of protection should be determined through the claims. In addition, although some embodiments of the present disclosure are disclosed above, they are not intended to limit the scope of the present disclosure.

Reference throughout this specification to features, advantages, or similar language does not imply that all of the features and advantages that may be realized with the present disclosure should be or are in any single embodiment of the disclosure. Rather, language referring to the features and advantages is understood to mean that a specific feature, advantage, or characteristic described in connection with an embodiment is included in at least one embodiment of the present disclosure. Thus, discussions of the features and advantages, and similar language, throughout this specification may, but do not necessarily, refer to the same embodiment.

Furthermore, the described features, advantages, and characteristics of the disclosure may be combined or re-organized in any suitable manner in one or more embodiments. One skilled in the prior art will recognize, in light of the description herein, that the disclosure can be practiced without one or more of the specific features or advantages of a particular embodiment. In other instances, additional features and advantages may be recognized in certain embodiments that may not be present in all embodiments of the disclosure.

What is claimed is:

1. An electronic structure, comprising:
a substrate;
a first conductor disposed on the substrate having a first top surface and a first side surface;
a second conductor electrically connected to the first conductor and having a second top surface and a second side surface;
an insulator covering the first top surface and the first side surface of the first conductor;
a protective layer covering the second top surface of the second conductor and exposing the second side surface of the second conductor; and
a bump structure disposed on the second conductor;
wherein the protective layer comprises a metal material;
wherein the first conductor is in contact with the second conductor; and
wherein the insulator covers a first portion of the first top surface and exposes a second portion of the first top surface.

2. The electronic structure as claimed in claim 1, wherein the second conductor is a redistribution layer.

3. The electronic structure as claimed in claim 1, wherein the bump structure comprises a pillar-like conductor and a bump disposed on the pillar-like conductor.

4. The electronic structure as claimed in claim 3, wherein an alloy temperature of the protective layer and the bump is greater than 500° C.

5. The electronic structure as claimed in claim 4, wherein a material of the protective layer comprises titanium, titanium tungsten or platinum.

6. The electronic structure as claimed in claim 1, wherein an alloy temperature of a material of a top portion of the second conductor and the bump is less than 500° C.

7. The electronic structure as claimed in claim 1, wherein a ratio of an area of the bump structure in a top view to the second top surface is within a range of 5% to 60%.

8. An electronic structure, comprising:
a substrate;
a plurality of conductors disposed on the substrate;
a bump structure disposed on at least one of the plurality of conductors;
a protective layer disposed on the plurality of conductors and exposing a region between the plurality of conductors;
an excitation electrode disposed on the substrate; and
a cover disposed on the excitation electrode and forming a space on the excitation electrode;
wherein the protective layer is disposed on a top surface of the plurality of conductors and exposes a side surface of the plurality of conductors;
wherein the at least one of the conductors extends onto the cover, and the bump structure is disposed on the cover.

9. The electronic structure as claimed in claim 8, wherein the bump structure comprises a pillar-like conductor and a bump disposed on the pillar-like conductor.

10. The electronic structure as claimed in claim 9, wherein an alloy temperature of the protective layer and the bump is greater than 500° C.

11. The electronic structure as claimed in claim 9, wherein an alloy temperature of a material of a top portion of the plurality of conductors and the bump is less than 500° C.

12. The electronic structure as claimed in claim 9, wherein a portion of the protective layer is disposed between the at least one of the conductors and the bump structure.

13. The electronic structure as claimed in claim 8, wherein the space is inversely tapered.

14. The electronic structure as claimed in claim 8, wherein a height in a central portion of the space is less than a height in a peripheral region of the space.

* * * * *